United States Patent [19]
Choi et al.

[11] Patent Number: 6,028,788
[45] Date of Patent: Feb. 22, 2000

[54] FLASH MEMORY DEVICE

[75] Inventors: Jeong-hyuk Choi, Seoul; Wang-chul Shin, Yongin, both of Rep. of Korea

[73] Assignee: Samsung Electronics, Co., Ltd., Suwon, Rep. of Korea

[21] Appl. No.: 08/922,047

[22] Filed: Sep. 2, 1997

[30] Foreign Application Priority Data

Aug. 30, 1996 [KR] Rep. of Korea ...................... 96-37219

[51] Int. Cl.[7] .................................................. G11C 16/04
[52] U.S. Cl. ............................... 365/185.11; 365/185.17; 365/185.33
[58] Field of Search .......................... 365/185.11, 185.17, 365/185.33

[56] References Cited

U.S. PATENT DOCUMENTS

| | | | |
|---|---|---|---|
| 4,962,481 | 10/1990 | Choi et al. | 365/185.17 |
| 5,517,448 | 5/1996 | Liu | 365/185.11 |
| 5,734,609 | 3/1998 | Choi et al. | 365/185.17 |
| 5,936,887 | 8/1999 | Choi et al. | 365/185.17 |

*Primary Examiner*—Trong Phan
*Attorney, Agent, or Firm*—Marger Johnson & McCollom, P.C.

[57] ABSTRACT

A flash memory device for providing high integration and high-speed data access has string blocks arranged in a two-dimensional manner. Each string block has a plurality of strings, at least one bit line select line, a plurality of word lines, a plurality of source line select lines, a first dual-mode line, and a second dual-mode line. Each string is constructed such that at least one bit line select transistor, a plurality of unit memory cells, and a plurality of source line select transistors are connected in series. The bit line select lines are connected to respective gates of the bit line select transistors. The plurality of word lines are connected to respective control gates of the plurality of unit memory cells. The first dual-mode line is connected to one end of each of the strings in a first string block through a bit line contact, and the second dual-mode line is connected to other end of each of the strings in the first string block through a source line contact. Additionally, the first dual-mode line is connected to the source line contact of a second string block while the second dual-mode line is connected to the bit line contact of a third string block.

12 Claims, 12 Drawing Sheets

FIG. 3 (PRIOR ART)
|  | ERASURE | PROGRAM | READ |
|---|---|---|---|
| B/L1 | FLOATING | 0V | 0V |
| B/L2 | FLOATING | Vpi | 0.7V |
| SSL | Vers | Vpass | Vcc |
| W/Ln(n≠3) | 0V | Vpass | Vcc |
| W/L3 | 0V | Vpgm | 0V |
| GSL | Vers | 0V | Vcc |
| CSL | FLOATING | 0V | 0V |
| BULK | Vers | 0V | 0V |
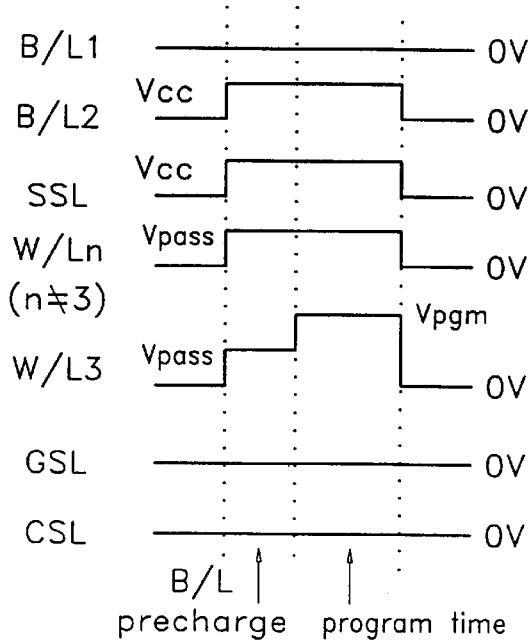
FIG. 4A (PRIOR ART)
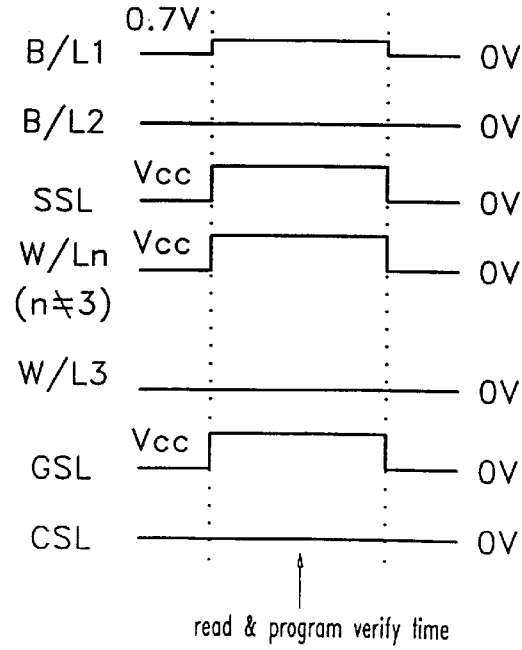
FIG. 4B (PRIOR ART)

erase time

B/L precharge | program time read & program verify time

FIG. 15A
FIG. 15B
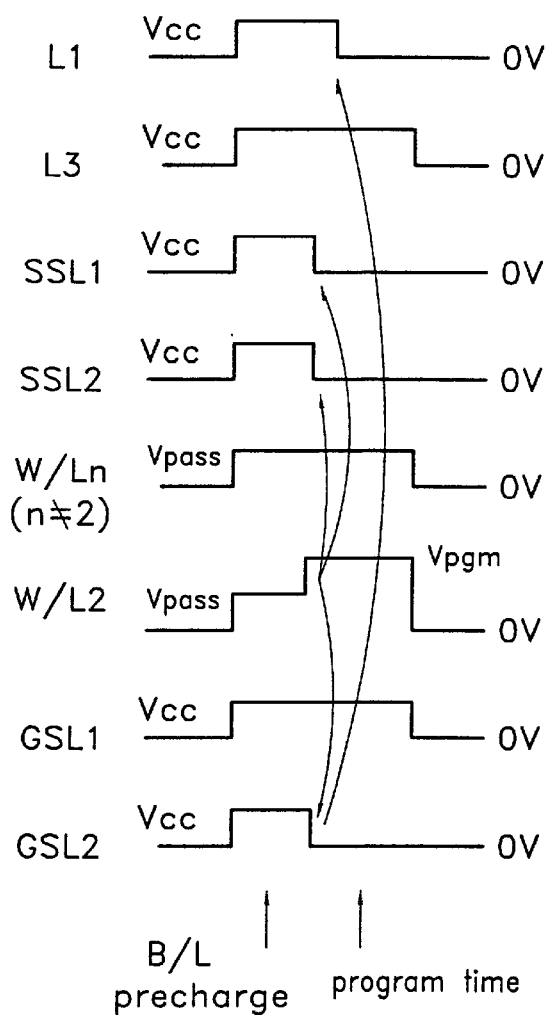
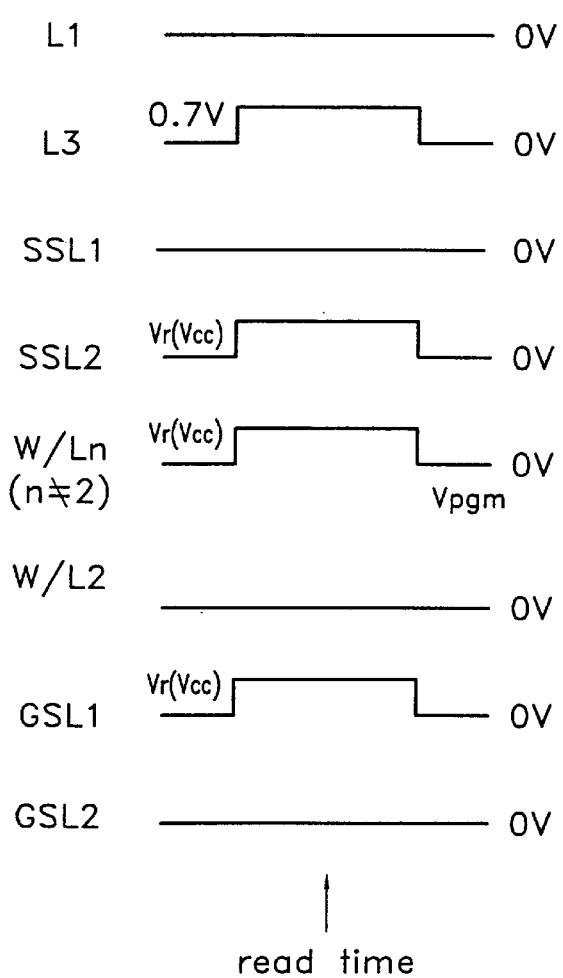

FLASH MEMORY DEVICE

BACKGROUND OF THE INVENTION

1. Field of the Invention

The present invention relates to a semiconductor memory device, and more particularly, to a flash memory device with high integration and high-speed memory access.

2. Description of the Related Art

Lately, non-volatile memory devices capable of electrically erasing and overwriting data have become larger and highly integrated. Generally, a cell transistor used in a non-volatile memory device has a floating gate and a control gate. These memory devices are largely divided into two types of devices according to the connection pattern employed therein, namely a NOR type and a NAND type device.

Specifically, the NOR type non-volatile memory device is constructed such that two memory cells, facing each other, share a bit line contact as well as a source line. Thus, a plurality of memory cells are connected to one bit line in parallel. Furthermore, a channel hot electron method is employed when storing data and a Fowler-Nordheim (F-N) tunneling method is employed when data is erased. To achieve such operations, the NOR type non-volatile memory device requires a large amount of cell current, which is, unfortunately, disadvantageous for high integration. However, this type of non-volatile memory device has the advantage of easily providing for high-speed memory access.

The NAND-type non-volatile memory device is also constructed such that two cell strings share a bit line contact and one source line. However, in this type of memory device, a cell string is arranged such that a plurality of cell transistors are serially connected to a bit line. In the NAND type non-volatile memory device, F-N tunneling is generated between a substrate and a floating gate of the memory cell transistor according to a voltage applied to a control gate of the memory cell and to the substrate. Thereby, either a storage or an erase operation can be performed depending on the voltage applied. Because only a small amount of cell current is required for this type of memory device, high-speed operation is more difficult to achieve but high integration within the memory device is facilitated. Consequently, since a NAND-type non-volatile memory cell array is more highly integrated than a NOR-type non-volatile memory cell array, it is preferred for attaining a high storage capacity memory device.

FIG. 1 shows the vertical structure of a unit string of a conventional single bit line NAND-type flash memory device. Referring to FIG. 1, the conventional single bit line NAND-type flash memory device is constructed with an n-well 3 formed on a p-type substrate 1 (otherwise, a p-well may be formed on the n-type substrate), and a p-well 5 formed in the n-well 3 (hereinafter, to be referred to as a "pocket p-well"). Next, an active region and a field isolating region (not shown) are formed on a bulk where the pocket p-well 5 is formed using conventional LOCOS technology. A tunnel oxide (not shown) for inputting and outputting electrons for the purpose of storing or erasing data of a cell is formed on the active region with a thickness of 80 Å to 100 Å. Thereafter, polysilicon 7, to be used as a floating gate, is separately formed in every cell and an ONO (Oxide-Nitride-Oxide) film 9, functioning as an interpoly isolating film, is formed with a thickness of 150 Å to 200 Å. Polycide 11 is then deposited for a selection line and a plurality of word lines, each word line used as a control gate of one of the memory cells in a string. Ions are implanted to form a source or drain 13 for each of a plurality of transistors and for each of the memory cells. Finally, a metal wiring 15 is formed to be used as a bit line.

In the NAND-type flash memory device, a unit memory cell operates using electron migration by F-N tunneling through the tunnel oxide. When an operating voltage is applied between the control gate and the bulk silicon (the pocket p-well), a predetermined voltage is induced into the floating gate by a coupling ratio of a capacitor Ci, comprised of an interpoly isolating film between the control gate and the floating gate, to a tunnel oxide capacitor Ct, formed between the bulk silicon and the floating gate. Specifically, during a programming operation, $Vf=(Ci \times Vpgm)/(Ct+Ci)$, and during an erasing operation, $Vf=(Ct \times Vers)/(Ct+Ci)$; where Vf is a voltage induced to the floating gate, Vpgm is a program voltage applied to the control gate, and Vers is an erase voltage applied to the bulk silicon. Accordingly, electron migration occurs by F-N tunneling through the tunnel oxide according to a voltage difference between the floating gate and the bulk silicon. A cell array is formed in the pocket p-well 5 for the purpose of separating an erasing voltage Vers of about 20V, which is applied to the bulk silicon during the erasing operation of a cell, from the bulk operating area of peripheral circuits.

FIG. 2 is a schematic circuit diagram of the conventional single bit line NAND-type flash memory device shown in FIG. 1 showing only two strings 20, representative of all the strings, each string connected to a bit line B/L1 and B/L2. Referring to FIG. 2, each of a plurality of unit strings 20 is constructed such that a plurality of unit memory cells MC1 through MC16 are serially connected between a drain of a bit line select transistor M1 and a source of a source line select transistor M2. The bit line select transistor M1 has a gate connected to a bit line select line SSL and a source connected to a respective one of the bit lines B/L1 or B/L2. The source line select transistor has a gate connected to a source line select line GSL and a drain connected to a common source line CSL. This arrangement thereby connects each of the bit lines B/L1 and B/L2 to the unit memory cells MC1 through MC16 of one of the unit strings.

FIG. 3 is a timing diagram illustrating a method of driving the conventional single bit line NAND-type flash memory device. The operation of the conventional single bit line NAND-type flash memory device shown in FIGS. 1 and 2 will now be described more completely with reference to FIG. 3. Specifically, a program operation for storing electrons in the floating gate of a cell is performed by applying a voltage to a selected cell. For example, a program voltage Vpgm is applied to a selected word line W/L3 of a selected unit memory cell A. A pass voltage Vpass is applied to the non-selected word lines W/Ln ($1 \leq n \leq 16$, $n \neq 3$) and to the bit line select line SSL. Finally, a ground voltage of 0V is applied to a selected bit line B/L1 and to the source line select line GSL while a precharge voltage Vpi is applied to a non-selected bit line B/L2. Accordingly, electrons are injected from the bulk silicon to the floating gate of the selected unit memory cell A by F-N tunnelling through the tunnel oxide according to an electrical field created by the difference between the program voltage Vpgm on the selected word line W/L3 and the ground voltage on the selected bit line B/L1.

At this time, although other cells are connected to the selected word line W/L3 (i.e., cell B), the cells connected to non-selected bit lines (i.e., B/L2), are not programmed. Specifically, since the pass voltage Vpass is applied to the bit line select line SSL and the non-selected word lines W/Ln ($1 \leq n \leq 16$, $n \neq 3$), and further, since the precharge voltage Vpi, applied to the non-selected bit line B/L2, is induced to a channel of the non-selected cell B, the intensity of the electrical field created by the program voltage Vpgm of the selected word line W/L3 is reduced. The electron tunneling effect is thereby suppressed and programming of the non-selected cells connected to the selected word line W/L3 is prevented.

An erase operation, for removing electrons from the floating gate of one of the unit memory cells, is performed by applying a ground voltage of 0V to the selected word line W/L3 and an erase voltage Vers of about 20V to the bulk silicon. Accordingly, electrons of the floating gate are removed by the electrical field created by the erase voltage Vers and holes are thereby injected into the floating gate of the memory cell.

A read operation, for reading a cell data value from one of the unit memory cells, utilizes the fact that the threshold voltage Vth of a cell becomes about +1V when electrons are stored in the floating gate of the cell and becomes about −3V when holes are stored therein. Specifically, the read operation is performed by applying a ground voltage of 0V to a selected word line W/L3, thereby reading the cell data value of logic "0" or "1" according to presence or absence of a current path through a selected cell.

When the operation scheme of the conventional single bit line NAND-type flash memory device is used, the precharge voltage Vpi applied to the non-selected bit lines must be higher than a supply voltage Vcc in order to prevent program disturbances in a high-density flash memory device. Therefore, in order to generate a high enough precharge voltage Vpi, a technique for pumping charges to the supply voltage Vcc using a capacitor is generally employed. Since the capacity of the capacitor is determined by a bit line capacitance, the capacitor for pumping charges must be larger when the bit line capacitance is increased as a result of high integration. Consequently, when the bit line capacitance is increased, the chip area occupied by the charge pumping capacitor also increases, and the time required for charging the non-selected bit lines with the precharge voltage Vpi increases, thereby causing an increase in the programming time. To solve this problem, a self-boosting technique is frequently used.

FIGS. 4A and 4B are timing diagrams illustrating a method of driving the conventional single bit line NAND-type flash memory device of FIGS. 1 and 2 using the prior art self-boosting technique. Particularly, FIG. 4A illustrates conditions for a program operation and FIG. 4B illustrates conditions for a read operation.

Referring to FIGS. 2, 3 and 4A, the self-boosting technique during the program operation is performed by applying the supply voltage Vcc to the non-selected bit line B/L2 as well as to the bit line select line SSL. The program voltage Vpgm is applied to the selected word line W/L3, while the pass voltage Vpass is applied to the non-selected word lines W/Ln ($1 \leq n \leq 16$, $n \neq 3$). Finally, the ground voltage of 0V is applied to the selected bit line B/L1, the bulk silicon, and the source line select line GSL. Accordingly, the precharge voltage Vpi is self-boosted to the channel of a non-selected string. When this self-boosting technique is employed, therefore, a higher voltage, exceeding the supply voltage, is only required to be applied to the word line. Consequently, a charge pumping capacitor is required only for generating the higher voltage to be applied to the word line; as compared with the conventional art which necessitated charge pumping capacitors for generating higher voltages for the bit line as well as the word line. The chip area occupied by the charge pumping capacitor, as well as the time for charging the bit line with the precharge voltage Vpi, thereby decreases.

FIG. 5 shows a layout of the conventional single bit line NAND-type flash memory device shown in FIGS. 1 and 2, in which like symbols are used to designate like or equivalent portions of the memory device. Referring to FIG. 5, it is difficult to form a bit line 15 by a general metal wiring process in the conventional single bit line NAND-type flash memory device which will satisfy the desire for high integration. Therefore, a modified process is used which employs a poly pad layer on a contact region 17. Unfortunately, this results in an increase in processing steps. To solve this problem, a shared bit line cell technique has been proposed in which two neighboring strings share a single bit line.

FIG. 6 is a circuit diagram of a conventional NAND-type flash memory device adopting the shared bit line technique and the self-boosting technique. Only two of a plurality of string blocks 30, representative of all the string blocks in the device, are shown. Referring to FIG. 6, a first and a second string 30a and 30b of each of the string blocks 30 share a single bit line B/L1 or B/L2, respectively. The first string 30a is constructed such that a first and a second bit line select transistor M1 and M2, respectively, a plurality of unit memory cells MC1 through MC16, and a first source line select transistor M5 are connected in series between one of the bit lines B/L1 or B/L2 and the common source line CSL. Also, the second string 30b is similarly constructed such that third and fourth bit line select transistors M3 and M4, respectively, a plurality of unit memory cells MC17 through MC32, and a second source line select transistor M6 are connected in series between another one of the bit lines B/L1 or B/L2 and the common source line CSL.

FIGS. 7A through 7C are timing diagrams illustrating a method of driving the conventional NAND-type flash memory device shown in FIG. 6. Particularly, FIG. 7A illustrates conditions for the erase operation, FIG. 7B illustrates conditions for the program operation, and FIG. 7C illustrates conditions for the read operation. The operation of the conventional NAND-type flash memory device shown in FIG. 6, adopting the shared bit line cell technique and the self-boosting technique, will now be described with reference to FIG. 6, and FIGS. 7A to 7C.

Referring to FIGS. 6 and 7A, during an erase operation, electrons on the floating gates of all the cells connected to all word lines in the selected strings 30a and 30b are erased. The erase operation is performed by applying an erase voltage Vers of about 20V to the bulk where the cell array is formed and a ground voltage of 0V to all word lines W/Ln ($1 \leq n \leq 16$) of the selected strings 30a and 30b. The erase voltage Vers is also applied to the bit line select lines SSL1 and SSL2 and to the source line select line GSL. At this time, all word lines of non-selected strings (not shown), the bit lines B/L1 and B/L2, and common source line CSL are floated. Accordingly, electrons on the floating gates are erased by F-N tunneling through the tunnel oxide because of a voltage difference between the erase voltage Vers applied to the bulk and the ground voltage applied to the word lines W/Ln ($1 \leq n \leq 16$) of the selected strings. The threshold voltage Vth of all the cells in the selected strings 30a and 30b is thereby lowered to about −3V.

Referring to FIGS. 6 and 7B, a program operation comprises a step of pre-charging a non-selected bit line B/L2 in order to prevent a programming disturbance of non-selected cells, a programming step, and a program verifying step consisting of reading each cell in order to verify whether or not the selected cell has been adequately programmed. During the program operation, the supply voltage Vcc is first applied to each of the bit lines B/L1 and B/L2, while the pass voltage Vpass, which is higher than or equal to the supply voltage Vcc and lower than the program voltage Vpgm, is applied to the word lines W/L1 to W/L16. Thereby, the voltage applied to the bit lines B/L1 and B/L2 is precharged onto the channels of the cells. The program voltage Vpgm and the ground voltage of 0V are then sequentially applied to the selected word line W/L2, the bit line select line SSL2, and selected bit line B/L1, resulting in the precharge voltage Vpi, which was induced into the channel of the selected cell C, being discharged to be kept at 0V. Finally, electrons are injected into the floating gate of the selected cell C from the bulk silicon via the tunnel oxide as the program voltage Vpgm is applied to the selected word line W/L2 (about 18V). The threshold voltage of the selected cell C is thereby changed to about +1V, such that the selected cell C is programmed.

When the program voltage Vpgm is thus applied to the selected word line W/L2, the non-selected cells connected to the selected word line W/L2 get stressed. However, because the non-selected cells are electrically isolated from the bit lines B/L1 and B/L2 and from the source line CSL, they can be floated by the voltage applied to the bit line select lines SSL1 and SSL2 and to the source line select line GSL. In this floated state, the channel voltages of the non-selected cells are self-boosted to be higher than the supply voltage by the pass voltage Vpass applied to the non-selected word lines W/Ln ($1 \leq n \leq 16$, $n \neq 2$) and the program voltage Vpgm applied to the selected word line W/L2. Accordingly, a predetermined self-boosting voltage is retained at the channels of the non-selected cells, during the program operation, thereby preventing tunneling from the bulk, such that the non-selected cells are not programmed.

Since the program verifying operation consists of reading the respective cells to verify whether or not the selected cell is programmed, it is basically the same as the read operation which will be described below. It will therefore not be separately explained, but will be apparent from the following description of a read operation.

Referring to FIGS. 6 and 7C, a read operation for reading the state of cell data is performed by applying about 0.7V to the selected bit line B/L1 and by applying the supply voltage Vcc to the bit line select line SSL1, to the non-selected word lines W/Ln ($1 \leq n \leq 16$, $n \neq 2$), and to the source line select line GSL. The ground voltage of 0V is applied to the non-selected bit line B/L2, the bit line select line SSL2, and the selected word line W/L2. Accordingly, if the threshold voltage of the selected cell is programmed to be over 0V, a current of the bit line will not flow through the cell. However, the bit line current will flow through the cell if the threshold voltage of the cell is erased and thereby lowered below 0V. The cell data value, corresponding to a logic level of "0" or "1", is then stored in a page buffer (not shown) and the stored data value can then be detected and amplified in a sense amplifier sequentially for each bit.

FIG. 8 shows a layout of one string block connected to a single bit line in the conventional NAND-type flash memory device employing the shared bit line technique and the self-boosting technique as shown in FIG. 6, in which like symbols are used for designating like or equivalent portions.

Referring to FIGS. 6 and 8, according to this conventional shared bit line NAND-type flash memory device, since two neighboring strings share one bit line, the integration level can be enhanced. Also, a sensing scheme using the self-boosting programming method and a page buffer can be employed. However, according to the high integration of the unit memory cells, the length of the active region where the source line is formed increases and the width thereof decreases, thereby increasing a resistance of the source line. Accordingly, the cell current is reduced by a bias of the source line during the read operation, which may result in a malfunction of the device.

SUMMARY OF THE INVENTION

To solve the foregoing problems, it is an object of the present invention to provide a flash memory device in which the source line resistance is reduced, the cell current is amplified and the cell area is reduced.

It is another object of this invention to provide a NAND-type flash memory device which enables both high integration and high-speed data access.

According to the above objects, a flash memory device according to the present invention has a plurality of string blocks arranged in a two-dimensional manner, with each string block comprising a plurality of strings, a bit line select line, a plurality of word lines, a plurality of source line select lines, and a plurality of dual-mode lines, including a first dual-mode line, and a second dual-mode line. Each string comprises a bit line select transistor, a plurality of unit memory cells and a plurality of source line select transistors are connected in series. The bit line select line is connected to a gate of the bit line select transistor(s). The plurality of word lines are connected to respective control gates of the plurality of unit memory cells. The first dual-mode line is connected to first ends of the strings of a first one of the string blocks through a bit line contact, and the second dual-mode line is connected to second ends of the strings of the first string block through a source line contact. The first dual-mode line is further connected to a source line contact of a second one of the string blocks, and the second dual-mode line is further connected to a bit line contact of a third one of the string blocks.

According to a further preferred embodiment of the present invention, each string comprises a plurality of bit line select transistors serially connected, with each bit line select transistor having a different threshold voltage from one another. The plurality of source line select transistors are also serially connected, with each source line select transistor having a different threshold voltage from one another. Also, when one of the first and second dual-mode lines operates as a bit line, the other operates as a source line, and vice-versa. A bipolar transistor is additionally formed in the bit line contacts of each of the string blocks for amplifying a cell current, thereby allowing for high-speed data access as well as high integration.

BRIEF DESCRIPTION OF THE DRAWINGS

The above objects and advantages of the present invention will become more apparent through the following detailed descriptions of a first and a second preferred embodiment thereof, with reference to the attached drawings in which:

FIG. 3 is a timing diagram illustrating a method of driving the conventional single bit line NAND-type flash memory device shown in FIG. 1;

FIGS. 4A and 4B are timing diagrams illustrating a method of driving the conventional single bit line NAND-type flash memory device of FIG. 1 when using a self-boosting technique, wherein, FIG. 4A illustrates conditions for a program operation thereof, and FIG. 4B illustrates conditions for a read operation thereof;

FIGS. 7A to 7C are timing diagrams illustrating a method of driving the conventional NAND-type flash memory device shown in FIG. 6, wherein, FIG. 7A illustrates the conditions for an erase operation thereof, FIG. 7B illustrates the conditions for a program operation thereof, and FIG. 7C illustrates the conditions for a read operation thereof;

FIGS. 12A to 12C are timing diagrams illustrating a method of driving the NAND-type flash memory device shown in FIG. 9, wherein, FIG. 12A illustrates the conditions for an erase operation thereof, FIG. 12B illustrates the conditions for a program operation thereof, and FIG. 12C illustrates the conditions for a read operation thereof;

FIGS. 15A and 15B are timing diagrams illustrating a method of driving the NAND-type flash memory device of the second preferred embodiment of the present invention shown in FIG. 13, wherein, FIG. 15A illustrates the conditions for a program operation thereof, and FIG. 15B illustrates the conditions for a read operation thereof.

DESCRIPTION OF THE PREFERRED EMBODIMENTS

In the flash memory device according to a first embodiment of the present invention, since a plurality of string blocks are two-dimensionally arranged, only one string block will be described herein from which the operation of the entire device will be apparent.

Figure 1:
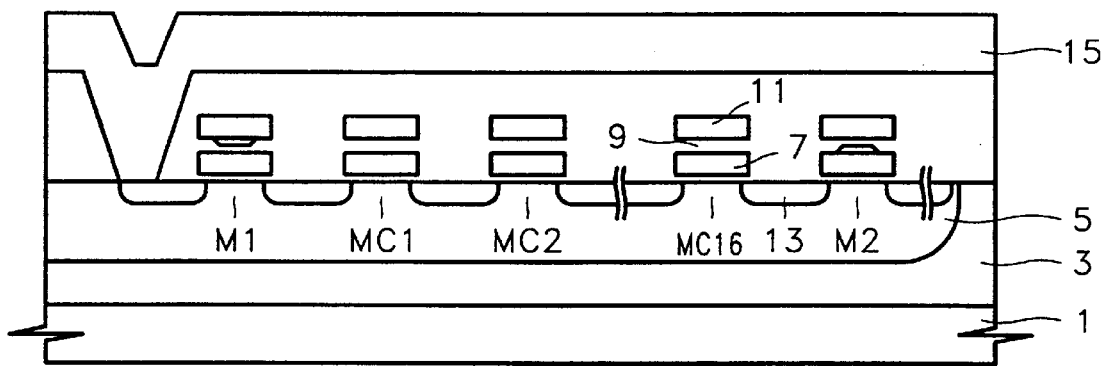
FIG. 1 is a vertical sectional view of a conventional single bit line NAND-type flash memory device.
Figure 2:
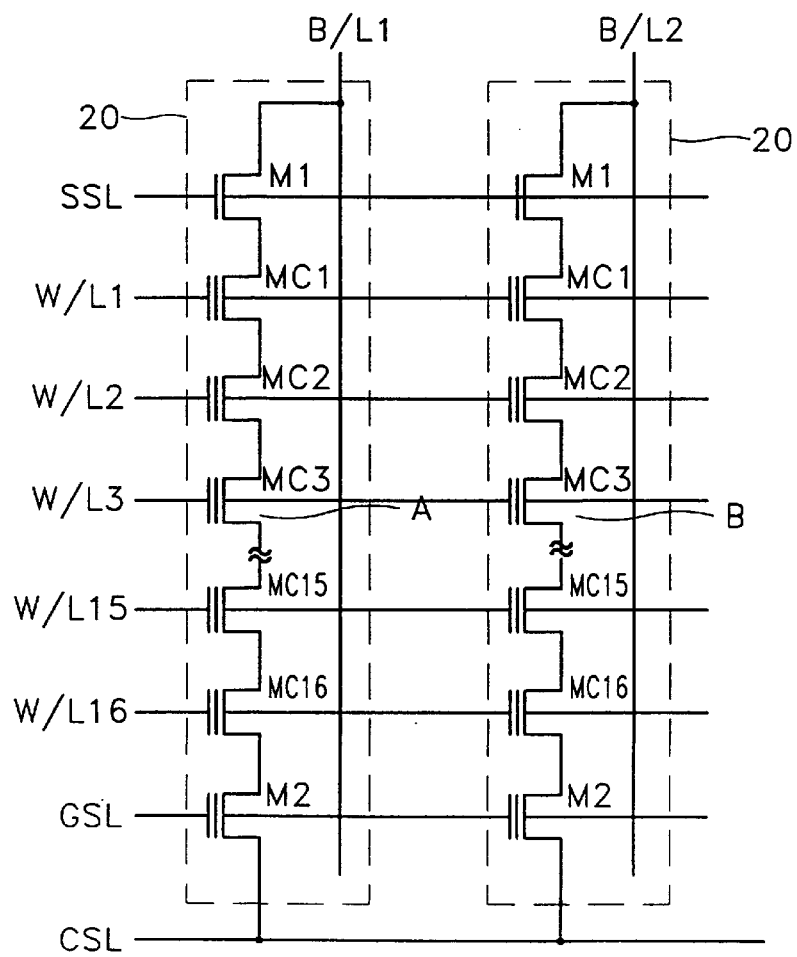
FIG. 2 is a circuit diagram of the conventional single bit line NAND-type flash memory device shown in FIG. 1.
Figure 5:
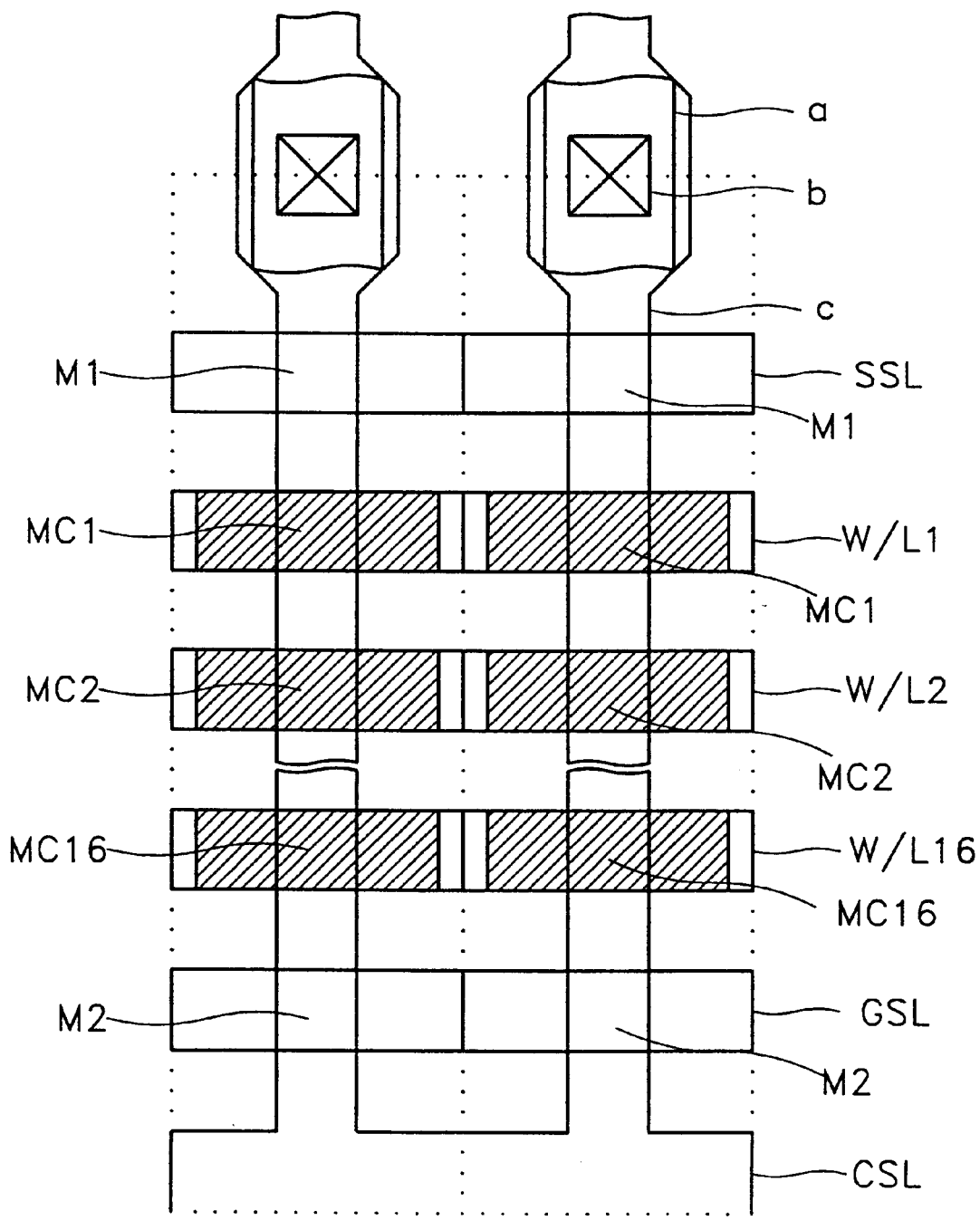
FIG. 5 shows a layout of the conventional single bit line NAND-type flash memory device circuit shown in FIG. 2.
Figure 6:
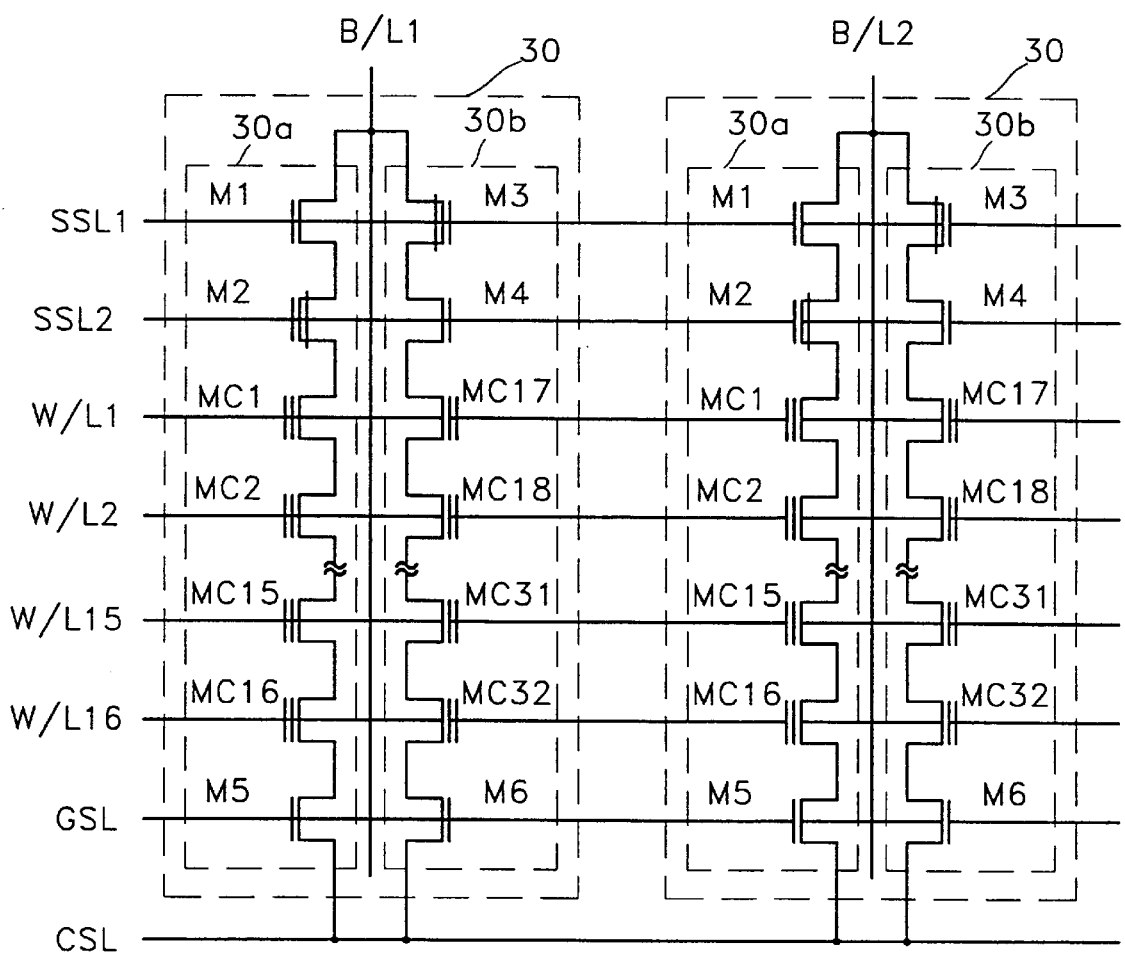
FIG. 6 is a circuit diagram of a conventional NAND-type flash memory device adopting a shared bit line technique and the self-boosting technique.
Figure 7A:
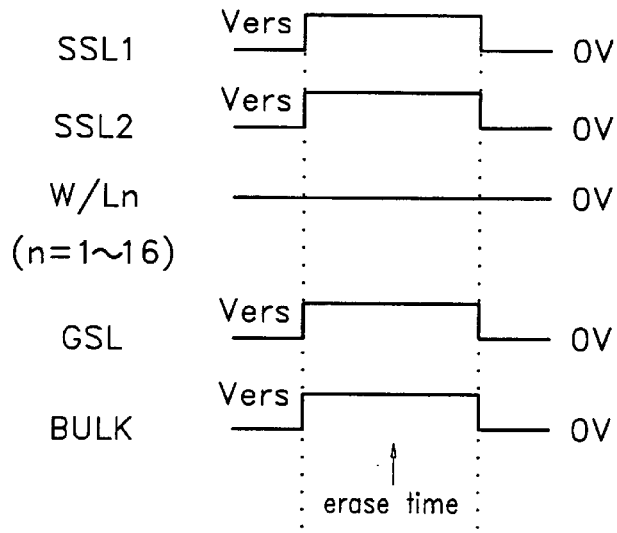
Figure 7B:
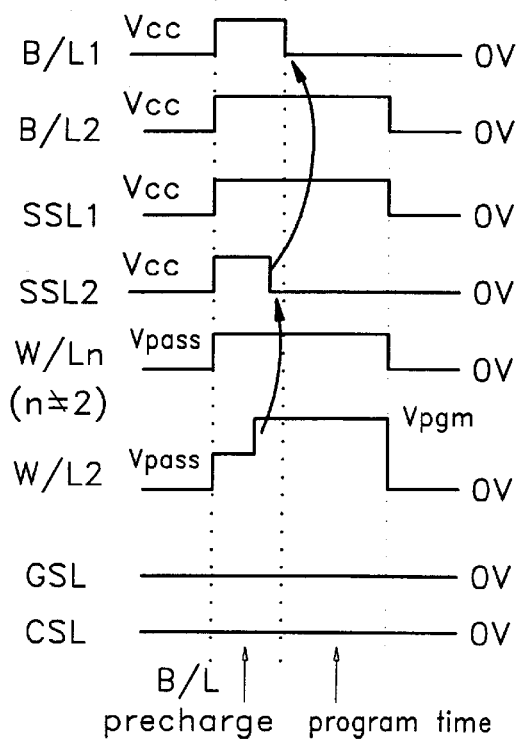
Figure 7C:
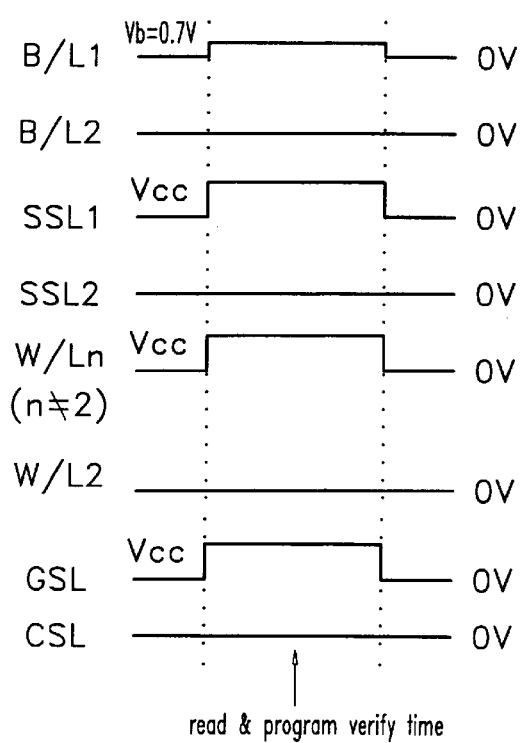
Figure 8:
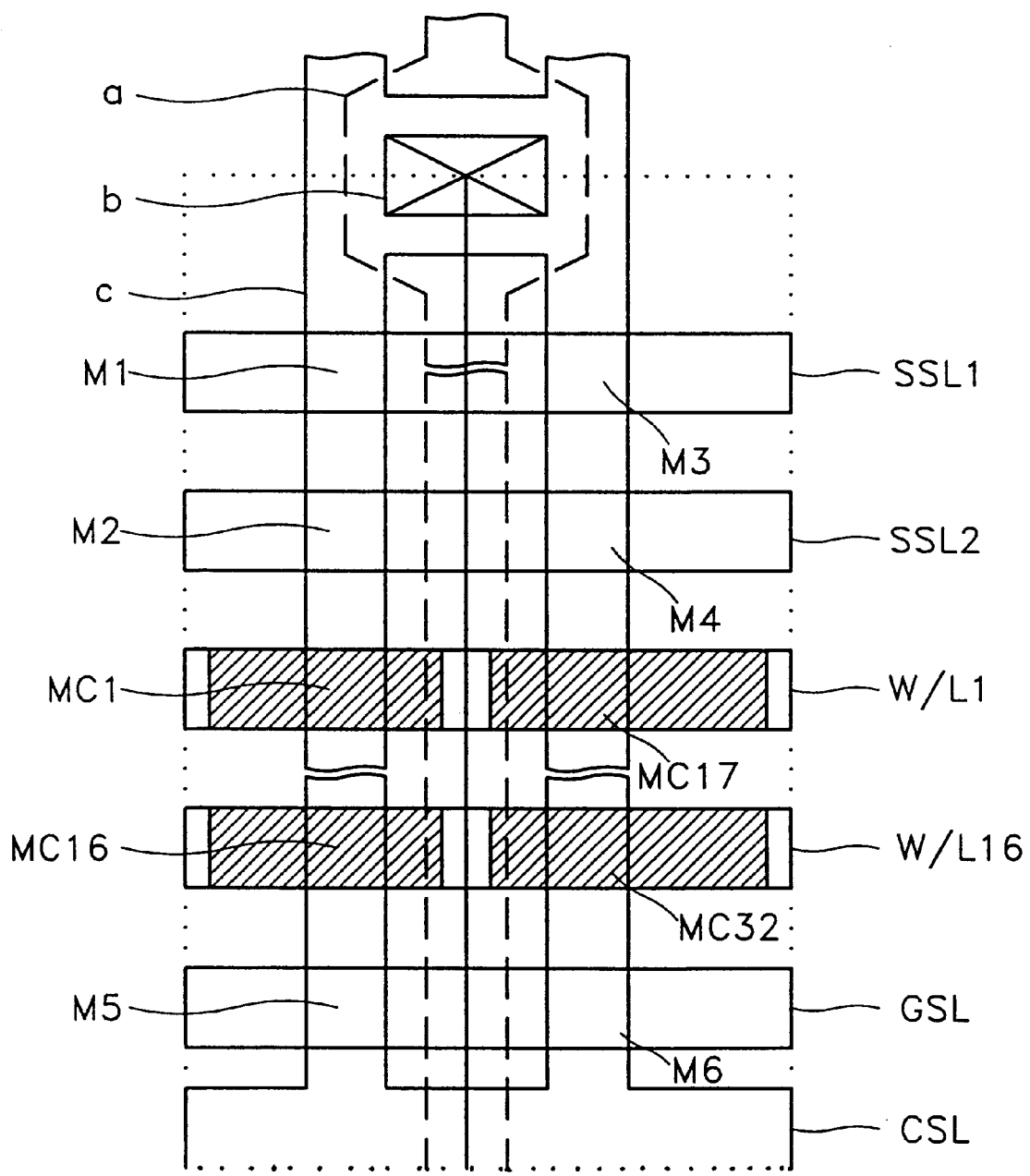
FIG. 8 shows a layout of the NAND-type flash memory device shown in FIG. 6 adopting the shared bit line technique and the self-boosting technique.
Figure 9:
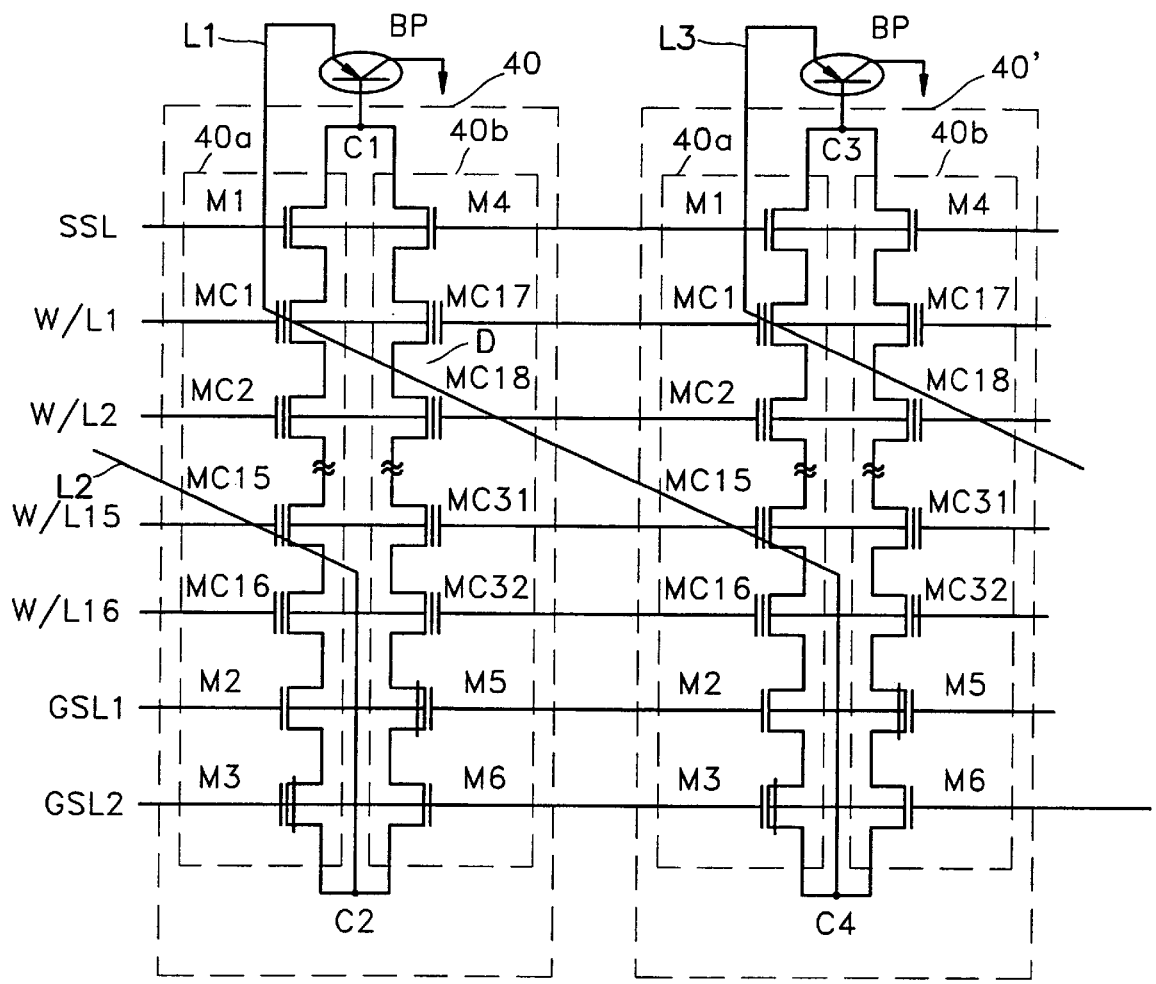
FIG. 9 is a circuit diagram of a NAND-type flash memory device according to a first preferred embodiment of the present invention.
Figure 10:
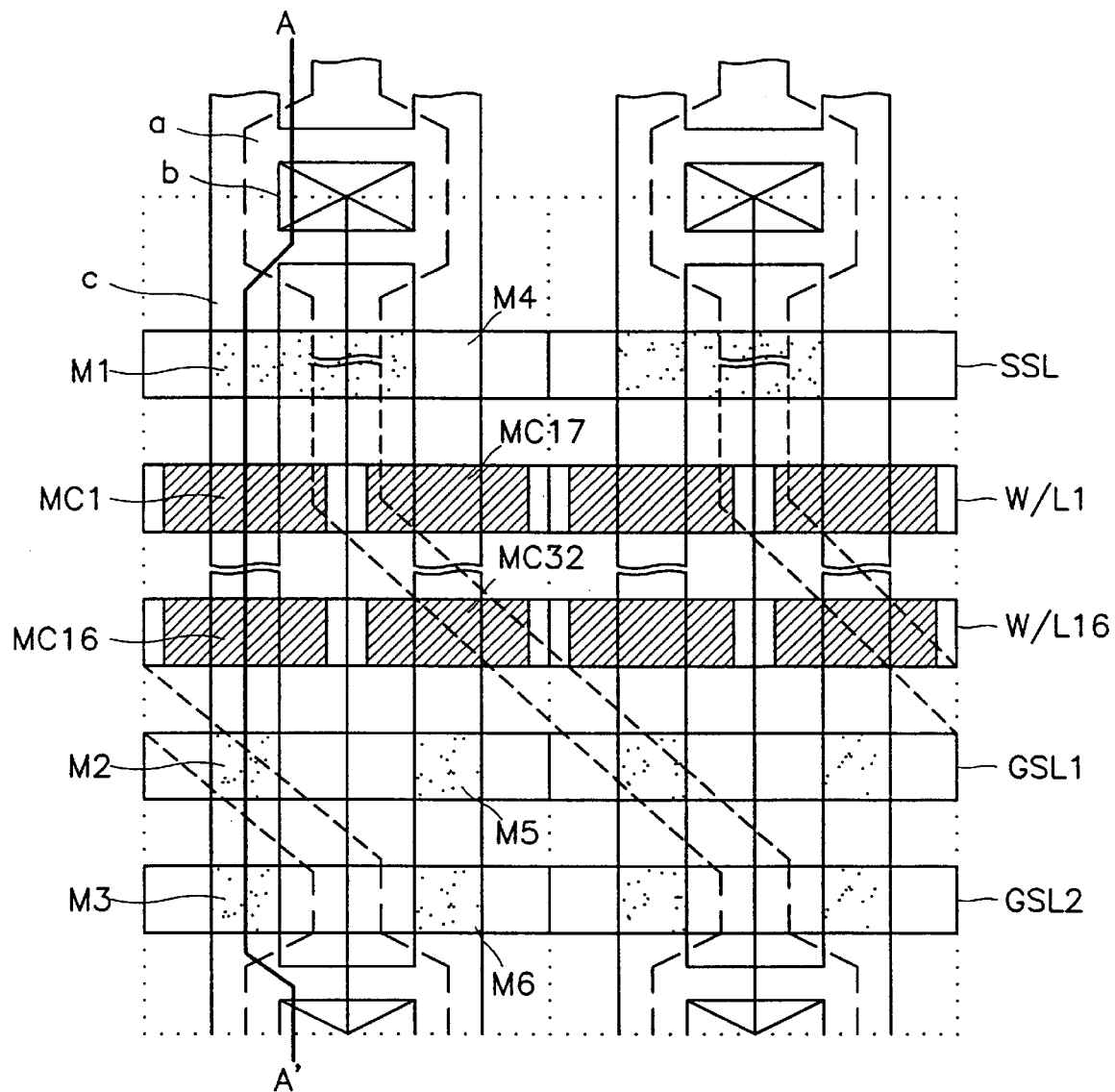
FIG. 10 shows a layout of the NAND-type flash memory device of the first preferred embodiment of the present invention as shown in FIG. 9.

Referring to FIGS. 9 and 10, a first string block 40 of the flash memory device according to a first embodiment of the present invention includes a first and a second string 40a and 40b, respectively. The first string 40a comprises a first bit line selection transistor M1, a plurality of unit of memory cells MC1 to MC16, and a plurality of source line selection transistors M2 and M3 connected in series. The second string 40b similarly comprises a second bit line selection transistor M4, a plurality of unit of memory cells MC17 to MC32, and a plurality of source line selection transistors M5 and M6 connected in series.

A first end of the first string 40a and a first end of the second string 40b are connected to a first dual-mode line L1 through a bit line contact C1. A second end of the first string 40a and a second end of the second string 40b are connected to a second dual-mode line L2 through a source line contact C2. The first dual-mode line L1 is also connected to a pair of second ends of a second pair of strings 40'a and 40'b through a source line contact C4 of a second string block 40'. The second dual-mode line L2 is connected to a pair of first ends of a third pair of strings through a bit line contact of a third string block (not shown). A pair of first ends of the pair of strings 40'a and 40'b of the second string block 40' are connected to a third dual-mode line L3 through a bit line contact C3. The first, second, and third dual-mode lines L1, L2, and L3, respectively, are each formed of a conductive material. Furthermore, the second and third dual-mode lines L2 and L3, respectively, operate as source lines when the first dual-mode line L1 operates as a bit line. When the first dual-mode line L1 operates as a source line, however, the second and third dual-mode lines L2 and L3, respectively, operate as bit lines.

The first and second bit line select transistors M1 and M4, respectively, are comprised of enhancement-type NMOS transistors, each having a gate. A bit line selection line SSL is connected to the gates of the first and second bit line select transistors M1 and M4, respectively. A plurality of word lines W/L1 through WL/16 are also provided. Each word line is connected to a control gate of one of the plurality of unit memory cells MC1 through MC16 located in the first string and also to a control gate of one of the plurality of unit memory cells MC17 through MC32 located in the second string. A first source line selection line GSL1 is connected to a gate of the source line select transistor M2 of the first string and to a gate of the source line select transistor M5 of the second string. A second source line selection line GSL2 is connected to a gate of each of the source line select transistors M3 and M6. The source line select transistors M2 and M6 are comprised of enhancement-type NMOS transistors, while the source line select transistors M3 and M5 are comprised of depletion-type NMOS transistors. The depletion-type NMOS transistors comprise different threshold voltages from those of the enhancement-type NMOS transistors. Finally, a PNP-type bipolar transistor BP, for amplifying cell current, comprising a base, and emitter, and a collector, is formed in the bit line contacts C1 and C3 of each of the string blocks. For example, the base of the bipolar transistor BP formed in the bit line contact C1 of the first string block 40 is connected to the first ends of the strings 40a and 40b so as to be in communication with the bit line select transistors M1 and M4. The emitter thereof is connected to the first dual-mode line L1, while the collector is connected to a P-type bulk where the string block is formed.

Figure 11:
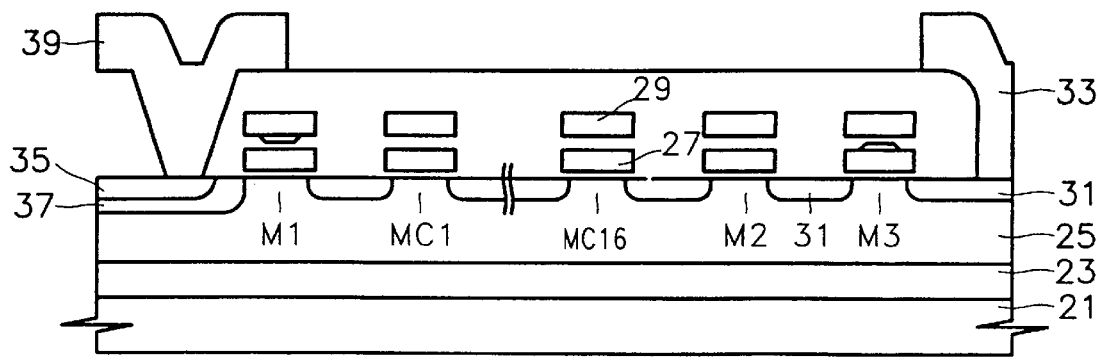
FIG. 11 is a vertical sectional view taken along the line A–A' of FIG. 10.

FIG. 11 is a vertical sectional view of the flash memory device of the first embodiment of the present invention taken along the line A–A' of FIG. 10. Referring to FIG. 11, the flash memory device is constructed with an n-well 23 and a pocket p-well 25 formed over a P-type substrate 21. The first bit line select transistor M1, the source line select transistors M2 and M3, and the plurality of unit memory cells MC1 through MC16 are formed above the pocket p-well 25. Each of the unit memory cells MC1 through MC16 comprises a floating gate 27 and a control gate 29. A source or drain 31 is formed on both sides of each of the transistors and unit memory cells. The second dual-mode line 33 and the first dual-mode line 39 are formed such that they are connected to opposite ends of the string. The emitter 35 and the base 37 of the bipolar transistor are formed beneath the first dual-mode line 39 and next to the first bit line select transistor M1. The impurity of the base of the bipolar transistor 37 is of the same type as that of the source or drain 31, but the concentration of the base 37 is lower than that of the source or drain 31.

Figure 12A:
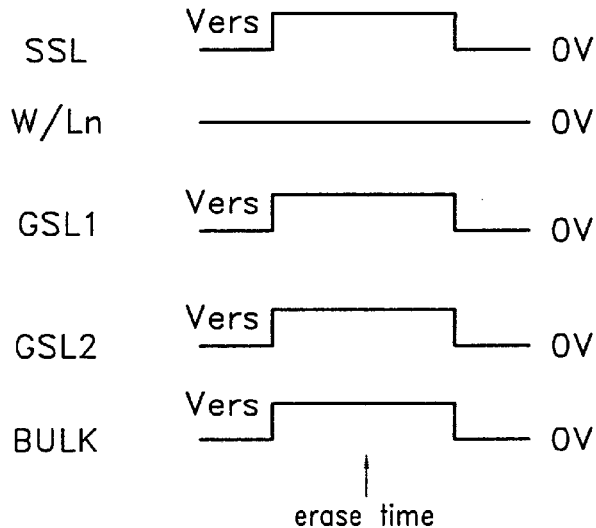
Figure 12B:
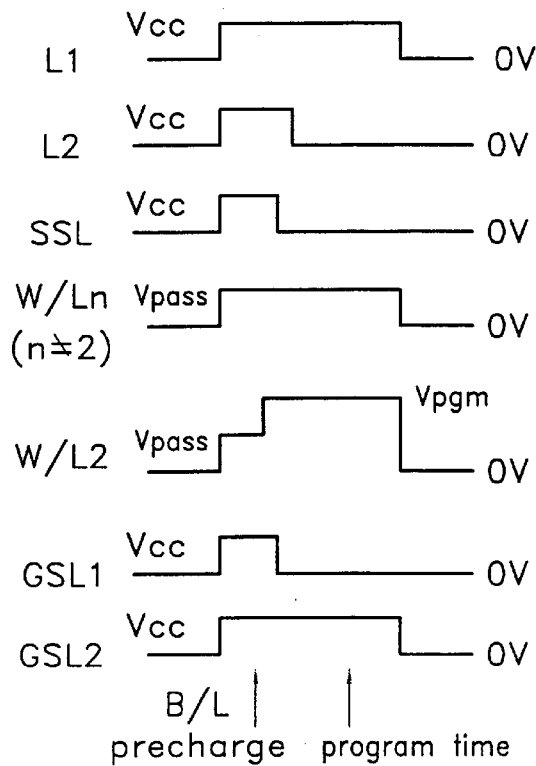
Figure 12C:
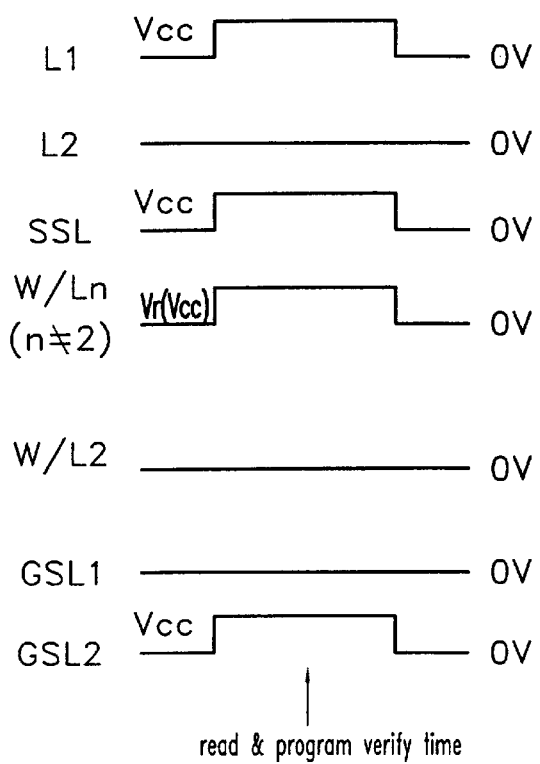

FIGS. 12A to 12C are timing diagrams illustrating a method of driving the NAND-type flash memory device shown in FIG. 9. Particularly, FIG. 12A is a timing diagram for an erase operation, FIG. 12B is a timing diagram for a program operation, and FIG. 12C is a timing diagram for a read operation thereof.

The driving method of the erase operation will now be described with reference to FIGS. 9 and 12A. If the cell D, connected to the word line W/L2, is selected for an erase operation, an erase voltage Vers of about 20V is applied to the bulk silicon substrate on which the memory cell array is formed, while a voltage which is the same as the erase voltage Vers is applied to the bit line select line SSL and to the plurality of source line select lines GSL1 and GSL2. A ground voltage is applied to the selected word line W/L2 connected to the selected cell D. At this time, the same voltage as the erase voltage Vers is also applied to the non-selected word lines W/Ln ($1 \leq n \leq 16$, $n \neq 2$) (otherwise, the non-selected word lines W/Ln ($1 \leq n \leq 16$, $n \neq 2$) can be floated). As a result, the electrons on the floating gate of the selected memory cell D, connected to the selected by the selected word line W/L2, migrate to the bulk to thereby be erased. Accordingly, the threshold voltage Vth of the selected memory cell becomes about −3V.

The driving method of the program operation will now be described with reference to FIGS. 9 and 12B. Specifically, when selecting a cell D disposed in the second string 40b to be programmed, the first dual-mode line L1 operates as a bit line and the second dual-mode line L2 operates as a source line. In practice, a supply voltage Vcc is applied to the first and second dual-mode lines L1 and L2, respectively, to the bit line select line SSL, and to the source line select lines GSL1 and GSL2. A pass voltage Vpass, higher than or equal to the supply voltage Vcc and lower than a program voltage Vpgm, is applied to each of the word lines W/L1 through W/L16 for a predetermined time, so that the channel regions of the plurality of memory cells MC1 through MC16 and MC17 through MC32 are precharged. Next, a program voltage Vpgm of about 18V is continuously applied to the selected word line W/L2 among the plurality of word lines W/L1 through W/L16 while the voltage Vpass is continuously applied to the non-selected word lines W/Ln ($1 \leq n \leq 16$, $n \neq 2$). Thereby, a channel region of the selected memory cell D connected to the selected word line W/L2 is self-boosted to over the precharge voltage. Therefore, because the pass voltage Vpass, which is lower than the program voltage Vpgm, is applied to the non-selected word lines W/Ln ($1 \leq n \leq 16$, $n \neq 2$), the non-selected cells of the selected second string 40b are prevented from being programmed.

Next, in order to discharge a voltage boosted in the memory cells of the selected second string 40b, only the selected string is connected to the source line (here, the second dual-mode line L2). This is accomplished by reducing the voltage applied to the bit line select line SSL and to the first source line select line GSL1 from the supply voltage Vcc to the ground voltage of 0V. At this time, the non-selected first string 40a is not connected to the second dual-mode line L2, operating as the source line, since the source line select transistor M2 is turned off by the ground voltage of 0V applied to the first source line select line GSL1. Thereafter, the channel voltage of the selected second string 40b is discharged to the second dual-mode line L2 by reducing the voltage applied to the second dual-mode line L2 (operating as the source line) from the supply voltage Vcc to the ground voltage of 0V. Accordingly, electrons are injected from the bulk to the floating gate of the selected cell D by F-N tunneling through the tunnel oxide because of the program voltage Vpgm applied to the selected word line W/L2 and the program operation is thus performed. Therefore, the threshold voltage of the selected cell D becomes about +1V. Also, since a voltage difference is reduced between the boosted channel voltage and the program voltage Vpgm applied to the selected word line W/L2 in the non-selected first string 40a, it is possible to prevent an undesired cell in the non-selected string 40a attached to the selected word line W/L2 from being accidentally programmed by a tunneling operation.

The driving method of a read operation will now be described with reference to FIGS. 9 and 12C. For example, when selecting a cell D in the second string 40b to be read, the supply voltage Vcc is applied to the bit line select line SSL, to the second source line select line GSL2, and to the non-selected word lines W/Ln ($1 \leq n \leq 16$, $n \neq 2$). A voltage of about 1.5V is applied to the first dual-mode line L1, while a ground voltage of 0V is applied to the second dual-mode line L2, to the selected word line W/L2 and first source line select line GSL1. Accordingly, a cell current flows through a source line (here, the second dual-mode line L2), when the selected cell D has been erased (i.e., has a threshold voltage Vth of about −3V). However, the cell current does not flow through the source line when the selected cell is programmed (i.e. has a threshold voltage Vth of about +1V). A sense amplifier (not shown) detects a voltage value of the bit line (here, the first dual-mode line L1), to thereby read the cell data value.

Since a PNP-type bipolar transistor BP, having a gain, a base, an emitter, and a collector, is formed in the bit line contact C1, when the cell current flows through the source line (i.e., the second dual-mode line L2), it becomes a base current of the bipolar transistor BP. Accordingly, a collector current amplified by the gain of the bipolar transistor BP flows through the bit line (i.e., the first dual-mode line L1). Therefore, because the cell current is amplified, the sense amplifier can perform the sensing operation rapidly, and the number of memory cells in a unit string can be increased while still allowing rapid data access.

Figure 13:
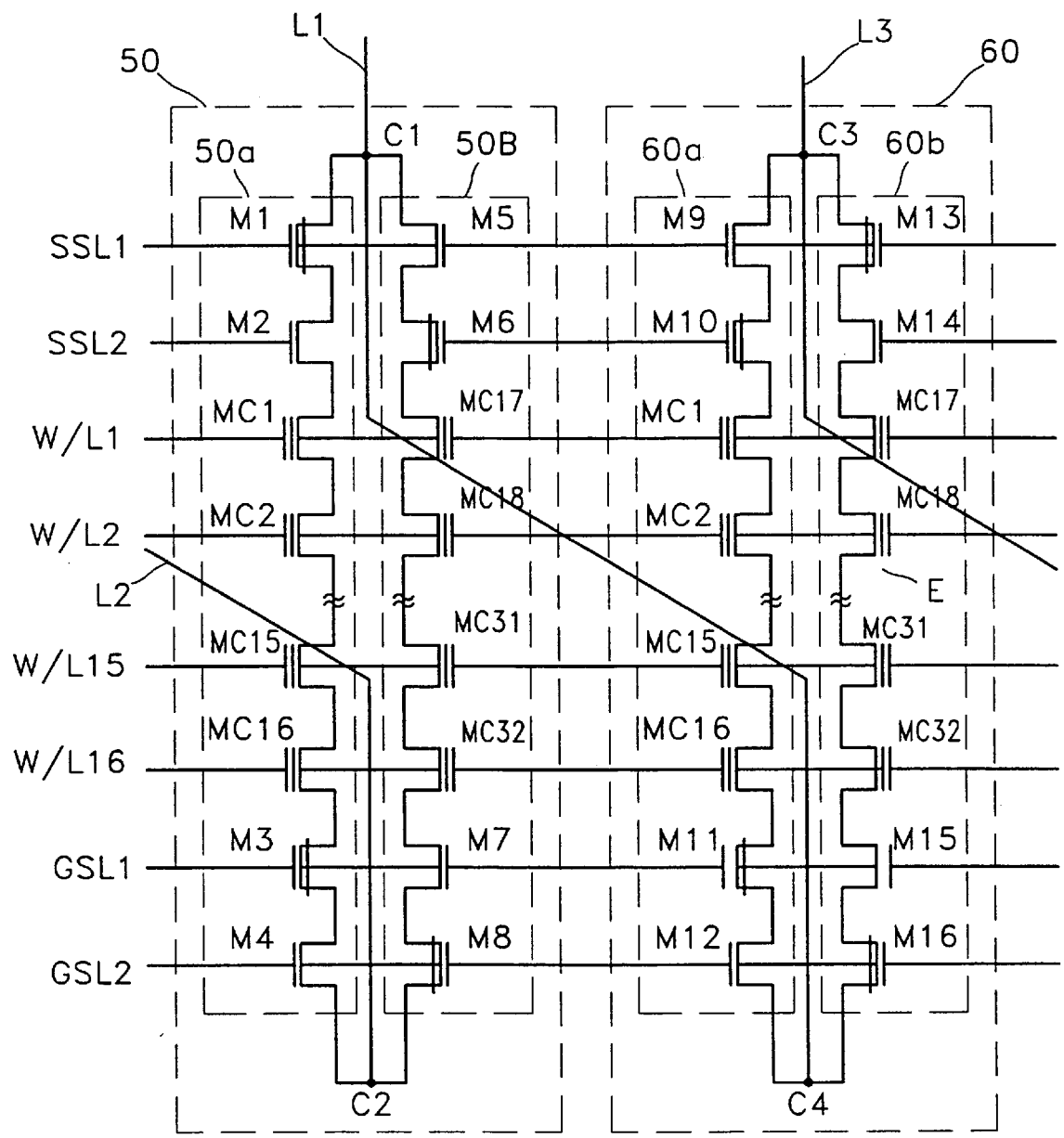
FIG. 13 is a circuit diagram of a NAND-type flash memory device according to a second preferred embodiment of the present invention.
Figure 14:
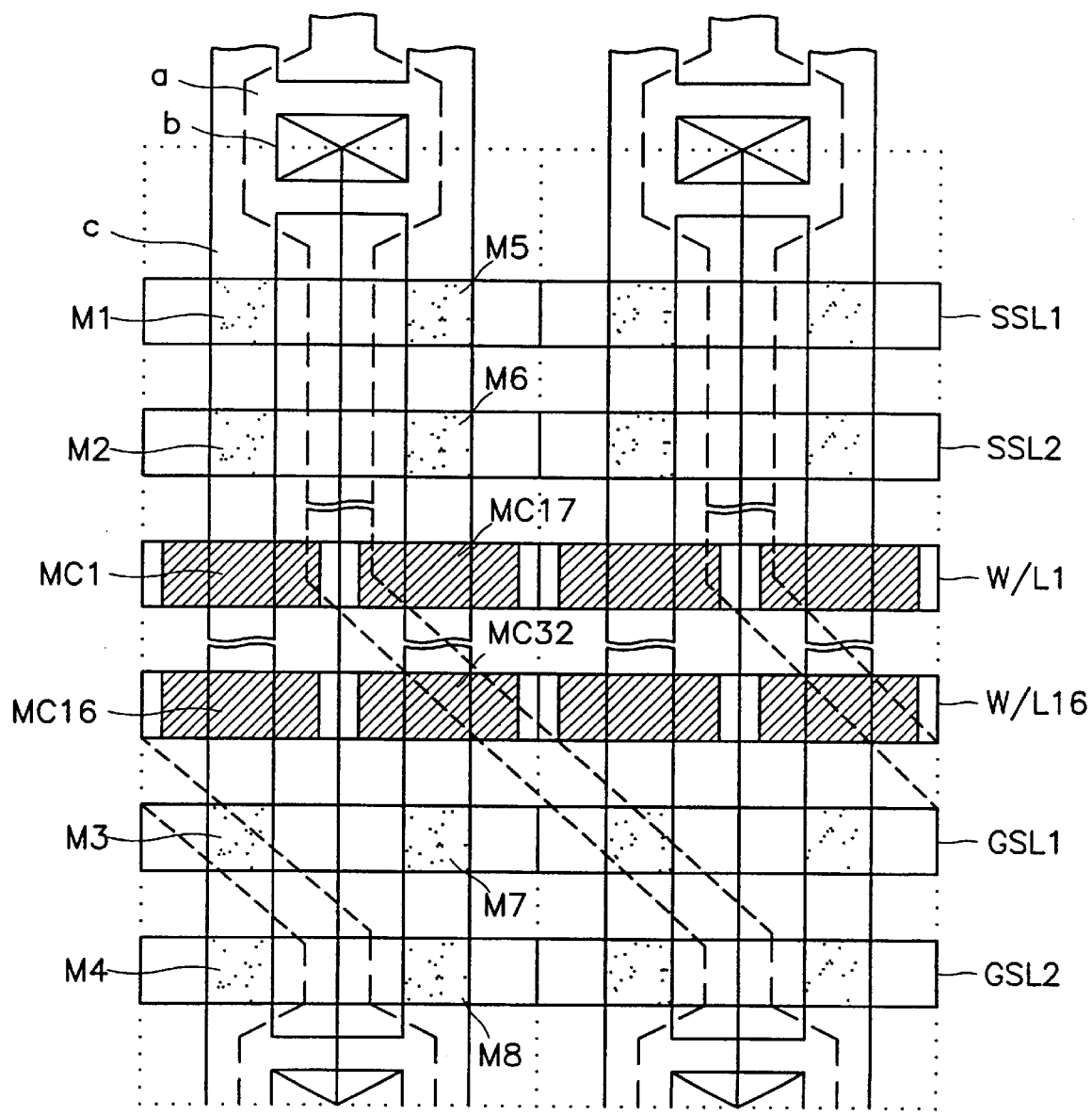
FIG. 14 shows a layout of the NAND-type flash memory device of the second preferred embodiment shown in FIG. 13.

FIG. 13 is a circuit diagram of a NAND-type flash memory device according to a second preferred embodiment of the present invention with only two string blocks shown. FIG. 14 shows a layout of the NAND-type flash memory device shown in FIG. 13. Since the flash memory device according to the second preferred embodiment of the present invention comprises a plurality of identical string blocks which are repeatedly arranged in a two-dimensional manner, only two string blocks need to be described to provide an understanding of the overall invention.

Referring to FIGS. 13 and 14, the flash memory device according to the second embodiment of the present invention is nearly identical to that of the first embodiment, except that each string has two bit line select transistors instead of just one, and the bipolar transistors formed in the bit line contacts of the first preferred embodiment may or may not be present in the second preferred embodiment. For example, a first string 50a of a first string block 50 has two bit line select transistors M1 and M2. In the same manner, a second string 50b of the first string block 50 has two bit line select transistor M5 and M6, a first string 60a of the second string block 60 has two bit line select transistor M9 and M10, and a second string 60b of the second string block 60 has two bit line select transistors M13 and M14. In this example, the bit line select transistors M1, M6, M10 and M13 are depletion-type NMOS transistors, while the bit line select transistors M2, M5, M9 and M14 are enhancement-type NMOS transistors. Moreover, a plurality of source line select transistors are located on each of the strings. The source line select transistors M3, M8, M11, and M16 of their respective strings are depletion-type NMOS transistors, while the source line select transistors M4, M7, M12, and M15 are enhancement-type NMOS transistors. Each of the transistors comprises a gate, a source, and a drain.

First ends of the first and the second strings 50a and 50b in the first string block 50 are connected to a first dual-mode line L1 through a bit line contact C1, and second ends thereof are connected to a second dual-mode line L2 through a source line contact C2. First ends of the first and the second strings 60a and 60b of the second string block 60 are connected to a third dual-mode line L3 through a bit line contact C3, and second ends thereof are connected to the first dual-mode line L1 through a source line contact C4. Moreover, although not shown, the second dual-mode line L2 is connected to first ends of a third pair of strings through a bit line contact of a third string block. The first, second, and third dual-mode lines L1, L2, and L3, respectively, are all made of a conductive material. In practice, the second and third dual-mode lines L2 and L3, respectively, operate as source lines when the first dual-mode line L1 operates as a bit line. However, when the first dual-mode line L1 operates as a source line, the second and third dual-mode lines L2 and L3, respectively, work as bit lines.

A first bit line select line SSL1 is connected to the gates of the bit line select transistors M1, M5, M9, and M13, respectively, and a second bit line select line SSL2 is connected to the gates of bit line select transistors M2, M6, M10, and M14. Each of a plurality of word lines W/L1 to W/L16 is connected to a control gate of one of a plurality of unit memory cells MC1 through MC16 of the first string and to a control gate of one of a plurality of memory cells M17 through MC32 of the second string, in each string block. A first source line select line GSL1 is connected to the gates of the source line select transistors M3, M7, M11, and M15, and a second source line select line GSL2 is connected to the gates of the source line select transistors M4, M8, M12, and M16. Moreover, although not shown herein, a PNP-type bipolar transistor (BP) for amplifying cell current, having the same connection structure as in the first embodiment (see FIG. 9), may be formed in the bit line contact of each of the string blocks (i.e., C1 and C3).

FIGS. 15A and 15B are timing diagrams illustrating a method of driving the flash memory device according to the second preferred embodiment of the present invention shown in FIG. 13. Particularly, FIG. 15A is a timing diagram for a program operation thereof, and FIG. 15B is a timing diagram of a read operation thereof. Because an erase operation thereof is the same as that of the first embodiment (see FIG. 12A), a detailed explanation thereof will be omitted here.

The driving method of the program operation will now be described with reference FIGS. 13 and 15A. For example, when selecting a cell E disposed in the second string 60b of the second string block 60, to be programmed, the first dual-mode line L1 operates as a source line and the second and third dual-mode lines L2 and L3, respectively, operate as bit lines. First, a supply voltage Vcc is applied to the first, second, and third dual-mode lines L1, L2 and L3, respectively, as well as to the bit line select lines SSL1 and SSL2 and to the plurality of source line select lines GSL1 and GSL2. The supply voltage Vcc or a pass voltage Vpass, which is higher than or equal to the supply voltage Vcc and lower than a program voltage Vpgm, is applied to each of the word lines W/L1 through W/L16 for a predetermined time, so that channel regions of the plurality of memory cells MC1 through MC16 and MC17 through MC32 are precharged. Next, a program voltage Vpgm of about 18V is continuously applied to the selected word line W/L2 among the plurality of word lines W/L1 through W/L16, while the pass voltage Vpass is continuously applied to the non-selected word lines W/Ln (1≦n≦16, n≠2), so that the channel region of the selected memory cell E, connected to the selected word line W/L2, is self-boosted to over the precharge voltage. Then, in order to discharge a voltage boosted in the memory cells of the selected string, only the selected second string 60b of the second string block 60 is connected to the source line (i.e., the first dual-mode line L1), by reducing the voltage applied to the bit line select lines SSL1 and SSL2 and the second source line select line GSL2 from the supply voltage Vcc to the ground voltage of 0V. At this time, the source line select transistor M12 is turned off while the source line select transistor M15 is turned on. The depletion-type source line select transistors M11 and M16 are turned on all the time, irrespective of the voltage applied to the source line select line GSL1 and GSL2. The first string 60a is not connected to the first dual-mode line L1, acting as the source line, since the source line select transistor M12 is turned off by the ground voltage of 0V applied to the second source line select line GSL2. Thereafter, the channel voltage of the second string 60b is discharged to the first dual-mode line L1 by reducing the voltage applied to the first dual-mode line L1 (operating as the source line) from the supply voltage Vcc to the ground voltage of 0V. Accordingly, electrons are injected from the bulk to the floating gate of the selected cell E by F-N tunneling through the tunnel oxide because of the voltage difference between the program voltage Vpgm applied to the selected word line W/L2 and the channel voltage on the selected string 60b. The program operation is thereby performed, resulting in the threshold voltage Vth of the selected cell E becoming about +1V. Also, since the voltage difference is reduced between the boosted channel voltage and the program voltage Vpgm applied to the selected word line W/L2 in the first string 60a, it is possible to prevent an undesired cell in the first string 60a connected to the selected word line W/L2 from being programmed by a tunneling operation.

The driving method of a read operation according to the second preferred embodiment of the present invention will now be described with reference to FIGS. 13 and 15B. For example, when selecting a cell E, in the second string 60b of the second string block 60, to be read, the supply voltage Vcc or a voltage Vr, higher than the supply voltage Vcc, for increasing read current, is applied to the bit line select line SSL2, to the first source line select line GSL1, and to the non-selected word lines W/Ln (1≦n≦16, n≠2). The ground voltage of 0V is applied to the first dual-mode line L1 (operating as a source line), to the bit line select line SSL1, to the selected word line W/L2, and to the second source line select line GSL2. Finally a read voltage of 0.7V is applied to the third dual-mode line L3. Thereby, a cell current flows through the source line L1 when the selected cell E is in an erased state (i.e., a threshold voltage Vth of around −3V). However, the cell current does not flow through the source line L1, when the selected cell is programmed (i.e., a threshold voltage of about +1V). A voltage value of the bit line (in this case, the third dual-mode line L3) is detected by a page buffer (not shown) to read a cell data value.

Furthermore, the NAND-type flash memory device according to the first and second preferred embodiments of the present invention are comprised of alternative bit lines in which conductive materials such as metals are slantingly connected between a bit line contact of one string block and a source line contact of a neighboring string block. Accordingly, active resistance of the source line can be removed, and a special metal region used for a source line is not necessary, thereby allowing for a reduced chip area.

Also, if PNP-type bipolar transistors are formed on all bit line contact regions, as described above, when a cell current flows through the source line, a base current flows in the base of the bipolar transistors and thus a collector current amplified by the gain of the bipolar transistors is generated. Accordingly, the bit line current flowing in the bit line is increased by the sum of the base current and collector current, thereby increasing the cell current and allowing for high-speed data access. Also, since the sensing current flowing in the source line can be reduced by the amount of the increase in the cell current, the number of cells in a unit string, which is determined by the limited value of an on-cell current, can be increased to over 64. Furthermore, since the number of contacts required for each string and the shared area for each cell occupied by a selected transistor are hereby reduced, it is possible to reduce the required cell area, and integration of the flash memory device can be additionally enhanced.

It should be noted that the present invention is not limited by the above-described illustrative embodiments and that various modifications thereto may be made by one skilled in the art without departing from the spirit thereof. We therefore claim all modifications, combinations, and additions coming within the spirit and scope of the following claims.

What is claimed is:

1. A flash memory device having a first, a second, and a third string block arranged in a two-dimensional manner for constructing a memory cell array, each string block having a bit line contact and a source line contact, the flash memory device comprising:

a plurality of strings within each string block, each string having a first end and a second end;

a bit line select transistor having a gate disposed along each string;

a plurality of memory cells disposed along each string, each memory cell having a control gate;

a plurality of source line select transistors disposed along each string, each source line select transistor having a gate, the bit line select transistor, the unit memory cells and the source line select transistors being connected to each other in series;

a bit line select line being connected to the gate of the bit line select transistor;

a plurality of word lines, each word line being connected to the control gate of one of the memory cells in each string;

a plurality of source line select lines, each source line select line being connected to the gate of one of the source line select transistors in each string;

a first dual-mode line being connected to the first end of each of the strings in the first string block through the bit line contact thereof and being further connected to the source line contact of the second string block; and a second dual-mode line being connected to the second end of each of the strings in the first string block through the source line contact thereof and being further connected to the bit line contact of the third string block.

2. The flash memory device as claimed in claim 1, wherein the bit line select transistor comprises a plurality of bit line select transistors serially connected, each bit line select transistor having a threshold voltage different from the other(s).

3. The flash memory device as claimed in claim 1, wherein the plurality of source line select transistors are serially connected, each having a threshold voltage different from one another.

4. The flash memory device as claimed in claim 1, wherein the first dual-mode line operates as a source line when the second dual-mode line operates as a bit line, and vice-versa.

5. The flash memory device as claimed in claim 1, wherein a bipolar transistor having a base, an emitter, and a collector is formed in the bit line contact of each of the string blocks.

6. The flash memory device as claimed in claim 5, wherein the bipolar transistor is of a PNP type.

7. The flash memory device as claimed in claim 5, wherein the base of the bipolar transistor is connected to the line select transistor, the emitter of the bipolar transistor is connected to the first dual-mode line, and the collector of the bipolar transistor is connected to a P-type bulk substrate, in which the respective strings are formed.

8. The flash memory device as claimed in claim 5, wherein the impurity of a base region of the bipolar transistor is of the same type as that of a region where the source line contact is formed.

9. The flash memory device as claimed in claim 7, wherein a concentration of a base region of the bipolar transistor is lower than that of a source or drain of the unit memory cell.

10. A method of performing a program operation of a flash memory device comprising a plurality of dual-mode lines, a bit line select line, a plurality of word lines, a plurality of string blocks, and a plurality of strings in each of the string blocks, each string comprising a plurality of unit memory cells, the method comprising:

selecting one of the unit memory cells of a selected one of the strings to be programmed;

operating a first one of the dual-mode lines as as a bit line and a second one of the dual-mode lines as a source line;

applying a supply voltage to each of the dual-mode lines, to the bit line select line, and to the source line select lines;

applying a pass voltage higher than or equal to the supply voltage and lower than a program voltage to each of the word lines for a predetermined time, so that a channel region of each of the unit memory cells is precharged;

continuously applying a program voltage of about 18V to a selected word line among the plurality of word lines, while continuously applying the voltage to non-selected ones of the word lines, thereby self-boosting the channel region of the selected memory cell over a precharge voltage and preventing non-selected ones of the unit memory cells from being programmed; and discharging a channel voltage of each of the non-selected ones of the unit memory cells of the selected string by connecting only the selected string to the source line.

11. A method of performing a read operation of a flash memory device comprising a plurality of word lines, a plurality of dual-mode lines, a bit line select line, a plurality of source line select lines, a plurality of string blocks, and a plurality of strings in each of the string blocks, each string comprising a plurality of unit memory cells, the method comprising:

selecting one of the unit memory cells in a selected one of the strings connected to a selected one of the word lines to be read;

applying a supply voltage to the bit line select line, to a second one of the source line select lines, and to non-selected ones of the word lines;

applying a voltage of about 1.5V to one of the dual mode lines acting as a bit line;

applying a ground voltage of about 0V to one of the dual-mode lines acting as a source line, to the selected one of the word lines, and to a first one of the source line select lines, such that a cell current flows through the dual-mode line acting as the source line when the selected unit memory cell has been erased but does not flow when the selected unit memory cell is programmed; and detecting a voltage value of the dual-mode line acting as a bit line using a sense amplifier to read a cell data value.

12. The method of performing a read operation according to claim 11, in which each string block comprises a bit line contact in which a bipolar transistor having a base, an emitter, and a collector is formed, the method further comprising:

amplifying the cell current through the bipolar transistor.

* * * * *